US011604557B2

(12) United States Patent
Dayde et al.

(10) Patent No.: US 11,604,557 B2
(45) Date of Patent: Mar. 14, 2023

(54) 3D INTERFACE WITH AN IMPROVED OBJECT SELECTION

(71) Applicant: DASSAULT SYSTEMES, Velizy Villacoublay (FR)

(72) Inventors: Guillaume Dayde, Sophia Antipolis (FR); Christophe Delfino, Sophia Antipolis (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 17/125,695

(22) Filed: Dec. 17, 2020

(65) Prior Publication Data

US 2021/0200420 A1 Jul. 1, 2021

(30) Foreign Application Priority Data

Dec. 26, 2019 (EP) .................................... 19306776

(51) Int. Cl.

*G06F 3/04815* (2022.01)
*G06F 3/04842* (2022.01)
*G06F 30/12* (2020.01)
*G06F 3/04845* (2022.01)

(52) U.S. Cl.

CPC ...... *G06F 3/04815* (2013.01); *G06F 3/04842* (2013.01); *G06F 3/04845* (2013.01); *G06F 30/12* (2020.01); *G06F 2203/04802* (2013.01); *G06F 2203/04806* (2013.01)

(58) Field of Classification Search

CPC .. G06F 3/04815; G06F 3/04842; G06F 30/12; G06F 3/0484; G06F 3/0481; G06F 30/10

See application file for complete search history.

(56) References Cited

U.S. PATENT DOCUMENTS

| | | | | | |
|---|---|---|---|---|---|
| 4,901,252 | A | * | 2/1990 | Fitzgerald | G06T 15/40 345/419 |
| 4,903,202 | A | * | 2/1990 | Crawford | G06T 17/00 378/901 |
| 4,982,180 | A | * | 1/1991 | Seki | G06T 15/20 345/421 |
| 5,825,998 | A | * | 10/1998 | Brechner | G06T 15/00 345/428 |
| 5,850,206 | A | * | 12/1998 | Kashiwagi | G06T 17/00 345/418 |
| 5,861,885 | A | * | 1/1999 | Strasnick | G06F 3/04842 715/850 |
| 5,861,889 | A | * | 1/1999 | Wallace | G06T 3/60 345/619 |

(Continued)

OTHER PUBLICATIONS

European Search Report dated Jun. 9, 2020, issued in corresponding application No. EP19306776.6, filed on Dec. 26, 2019, 7 pages.

*Primary Examiner* — Dino Kujundzic
*Assistant Examiner* — Jianmei F Duckworth
(74) *Attorney, Agent, or Firm* — Oblon, McClelland, Maier & Neustadt, L.L.P.

(57) ABSTRACT

A field user interface that displays 3D objects, receives a selection of an object by the user, and uses a comparison between sizes of objects and thresholds to perform the selection, in order that the selected objects are consistent with the intent of the user.

19 Claims, 6 Drawing Sheets

410 411 422 420 421 430 431 432

(56) References Cited

U.S. PATENT DOCUMENTS 5,867,610 A * 2/1999 Lee .......................... G06T 5/40 382/283
5,894,308 A * 4/1999 Isaacs .................... G06T 17/20 345/420
6,337,700 B1 * 1/2002 Kinoe .................. G06F 3/0481 715/854
6,611,267 B2 * 8/2003 Migdal .................. G06T 17/20 345/428
6,731,304 B2 * 5/2004 Sowizral ................ G06T 15/40 345/421
6,768,486 B1 * 7/2004 Szabo .................... G06T 17/20 345/420
7,194,114 B2 * 3/2007 Schneiderman ....... G06K 9/527 382/118
7,250,947 B2 * 7/2007 Piccuezzu .............. G06T 15/40 345/421
7,379,562 B2 * 5/2008 Wilson ................. G06F 3/0425 356/4.07
7,885,145 B2 * 2/2011 Marti ...................... G06F 3/011 367/118
7,890,890 B2 * 2/2011 Jarrett ................... G06K 9/222 715/863
8,073,198 B2 * 12/2011 Marti ...................... G06F 3/011 382/103
8,121,400 B2 * 2/2012 Tsai .................... G06K 9/3241 382/154
8,233,712 B2 * 7/2012 Maxwell ............. G06K 9/0063 382/173
8,274,508 B2 * 9/2012 Porikli ................ G06K 9/6214 345/419
8,291,049 B2 * 10/2012 Roos ................. H04N 21/4312 709/219
8,554,521 B2 * 10/2013 Diguet ................... G06F 30/00 703/1
8,610,712 B2 * 12/2013 Cohen ...................... G06T 7/12 345/419
8,744,130 B2 * 6/2014 Fukuchi ............ H04N 21/4108 382/103
8,902,219 B1 * 12/2014 Hauswirth ............. G06T 19/00 345/419
9,158,441 B2 * 10/2015 Hilton ..................... G06T 11/60
9,298,346 B2 * 3/2016 Le Clerc ............ G06F 3/04815
9,304,653 B2 * 4/2016 Moon ..................... G06T 11/60
9,384,593 B2 * 7/2016 Anttila ...................... G06T 9/00
9,407,674 B2 * 8/2016 Chan ..................... H04L 67/025
9,429,990 B2 * 8/2016 Starner .................. G06F 3/011
9,594,487 B2 * 3/2017 Schmidt ................ G06F 3/0486
9,721,187 B2 * 8/2017 Cook ........................ G06T 7/70
9,753,625 B2 * 9/2017 Gupta ................... G06T 11/203
10,416,836 B2 * 9/2019 Troy ..................... G06F 16/958
10,802,600 B1 * 10/2020 Ravasz .................. G06F 3/013
2001/0042118 A1 * 11/2001 Miyake .................. H04L 41/22 709/223
2002/0163515 A1 * 11/2002 Sowizral ................ G06T 15/40 345/419
2002/0167518 A1 * 11/2002 Migdal .................. G06T 17/20 345/428
2003/0071810 A1 * 4/2003 Shoov ..................... G06F 30/00 345/420
2004/0066966 A1 * 4/2004 Schneiderman ..... G06K 9/6857 382/159
2005/0198590 A1 * 9/2005 Jarrett .................. G06F 3/0481 715/863
2005/0226505 A1 * 10/2005 Wilson .................. G06F 3/0425 382/180
2005/0286767 A1 * 12/2005 Hager ................ G06K 9/00208 382/190
2006/0066609 A1 * 3/2006 Iodice ..................... G06T 19/20 345/419
2006/0103669 A1 * 5/2006 Piccuezzu ........... G06F 3/04845 345/620
2007/0165924 A1 * 7/2007 Nicponski ............. G06T 7/0012 382/128
2009/0109795 A1 * 4/2009 Marti .................... G06F 3/0346 367/118
2009/0110235 A1 * 4/2009 Marti ..................... G06F 3/043 382/103
2009/0276724 A1 * 11/2009 Rosenthal ......... G06F 16/24575 715/771
2010/0272357 A1 * 10/2010 Maxwell .................. G06K 9/34 382/173
2010/0302242 A1 * 12/2010 Buchanan .............. G06F 30/00 345/420
2010/0318929 A1 * 12/2010 Hilton .................. G06F 3/0482 715/769
2010/0325307 A1 * 12/2010 Roos .................... G06T 19/003 709/234
2011/0069892 A1 * 3/2011 Tsai .................... G06K 9/3241 382/218
2011/0112803 A1 * 5/2011 Diguet .................... G06F 30/00 703/1
2011/0141109 A1 * 6/2011 Radet .................... G06T 19/003 345/420
2011/0302535 A1 * 12/2011 Clerc .................. G06F 3/04817 715/848
2012/0139915 A1 * 6/2012 Muikaichi .............. G06T 19/00 345/419
2012/0154435 A1 * 6/2012 Murakami ............... G09G 5/14 345/629
2012/0206438 A1 * 8/2012 Porikli .............. G06K 9/00214 345/419
2012/0280927 A1 * 11/2012 Ludwig .................. G06F 3/017 345/173
2012/0287123 A1 * 11/2012 Starner .................. G06T 7/215 345/419
2012/0313939 A1 * 12/2012 Anttila ...................... G06T 9/00 345/420
2013/0127824 A1 * 5/2013 Cohen ..................... G06T 7/162 345/419
2013/0194260 A1 * 8/2013 Kunath .................. G06T 17/05 345/420
2013/0205248 A1 * 8/2013 Moon ..................... G06T 11/60 715/782
2013/0227493 A1 * 8/2013 Schmidt ............. G06F 3/04845 715/849
2013/0321403 A1 * 12/2013 Piemonte ............... G06T 15/00 345/419
2014/0003667 A1 * 1/2014 Fukuchi .................. G06F 3/005 382/103
2014/0207420 A1 * 7/2014 Edwards ................ G06T 19/00 703/1
2014/0368621 A1 * 12/2014 Michiyama ............ G06T 15/20 348/50
2015/0063679 A1 * 3/2015 Cook .................. G06K 9/6212 382/154
2015/0186555 A1 * 7/2015 Divekar ................. G06F 30/17 703/1
2015/0213572 A1 * 7/2015 Loss ........................ G06T 7/12 345/420
2015/0277706 A1 * 10/2015 Chan ....................... H04L 67/42 715/719
2016/0188159 A1 * 6/2016 Dayde ..................... G06F 30/00 715/782
2016/0274767 A1 * 9/2016 Gupta ................. G06F 3/04845
2017/0016719 A1 * 1/2017 Delfino ................. G06F 3/0488
2017/0139556 A1 * 5/2017 Josephson ........... G06F 3/04883
2018/0004283 A1 * 1/2018 Mathey-Owens ...... G06F 3/017
2018/0114371 A1 * 4/2018 Cullum ................... G06T 19/20
2019/0088031 A1 * 3/2019 Coulet .................. G06T 15/005
2019/0266772 A1 * 8/2019 Li ............................ G06T 3/40
2020/0211239 A1 * 7/2020 Ng ......................... A61B 6/025
2021/0090331 A1 * 3/2021 Ravasz ................ G02B 27/017

* cited by examiner

3D INTERFACE WITH AN IMPROVED OBJECT SELECTION

CROSS REFERENCE TO RELATED APPLICATIONS

This application claims priority under 35 U.S.C. § 119 or 365 to European Application No. 19306776.6, filed Dec. 26, 2019. The entire contents of the above application(s) are incorporated herein by reference.

FIELD

The present disclosure relates to the field of user interfaces. More specifically, it relates to the selection of 3D objects in a 3D user interface.

BACKGROUND 3D interfaces are nowadays used in a wide range of applications. Indeed, they allow users to interact with 3D objects, according to different angles of views. 3D interfaces are adaptable to a wide range of contexts. For example, the 3D modeling may be performed locally, by the computer the user interacts with, or remotely in a server, the user interacting with images that are sent by the server. In the latter case, the 3D interface and corresponding tool may be provided by Saas (Software as a Service).

One of the applications allowed by 3D interface is CAD (Computer-Aided Design), which consists in using a computer to design products in 3D. CAD applications allow designing virtually any product. Many CAD applications exist. For example, the CATIA composer allows a user to model a device using a plurality of 3D elements. CAD applications such as CATIA allow not only designing the shape of the product, but also performing a number of tests and simulations. They also allow generating a number of different view of the product, for example to generate 3D documentations.

In CAD applications, as in other applications that rely on 3D interfaces, a number of 3D objects are displayed to a user, and the user can select one or more objects he desires to interact with. In CAD applications, this allows for example the user to move objects/parts to organize a 3D scene. To do so, he has to select one or several parts using standard selection tools like mono selection which consist in selecting a single object, for example using a click or a tap, or multi-selection which consists in selecting a plurality of objects in the same time, for example using a plurality of clicks or taps, or a "selection trap" which consists in defining a shape (i.e rectangle, polygon, free shape . . . ), all objects under the shape being selected. Once one or more objects are selected, the user can modify them using any transformation tool provided by the 3D interface.

In previous systems, the selection of objects is directly mapped to the place wherein the selection was performed. For example, if the user clicked, the 3D object which is displayed at the place wherein the click is made is selected. However, the selection of 3D object which is then performed does not necessarily correspond to the intent of the user. This is more particularly true for complex scenes with a lots of 3D objects of different sizes: when the user clicks on the scene, the object which is selected may be a very small object that was precisely placed where the user clicked but was not even seen by the user. No previous system is currently able to ensure that the 3D objects that are selected are consistent with the intent of selection of the user.

There is therefore the need of a 3D interface that allows a user to view and select 3D objects, while ensuring that the selection is consistent with the selection that the user was likely intending to perform.

SUMMARY

To this effect, the disclosure describes a computer-implemented method, comprising the steps of: displaying on at least one display, a set of 3D objects; receiving from at least one input interface a selection by a user of at least one first 3D object belonging to said set calculating a 3D projection of said selection on said display; obtaining the outcome of a comparison of at least one size of said 3D projection to at least one threshold; if said outcome is negative, adding to or removing from said selection at least one second 3D object; modifying appearance parameters of said selection.

Advantageously, said at least one second 3D object is determined according to said at least one threshold.

Advantageously, the computer-implemented further comprises, while the outcome of said comparison is negative, a plurality of iterations of: adding to or removing from said selection at least one second 3D object; calculating the 3D projection of said selection on said display; obtaining the outcome of said comparison of said at least one size of said 3D projection to said at least one threshold.

Advantageously, adding to or removing from said selection at least one second 3D object comprises adding to said selection at least one second 3D object in a vicinity of said 3D projection, or removing from said selection at least one second 3D object at an edge of said 3D projection.

Advantageously, said set of 3D objects is organized as a tree, and: said selection is defined as a node of the tree, and includes the children of the node; adding to said selection at least one second 3D object comprises defining the parent of the node as the selection; removing from said selection at least one second 3D object comprises defining the child of the node that comprises said first 3D object as the selection.

Advantageously, said at least one size is a maximum distance between pixels of said 3D projection.

Advantageously, wherein said at least one size is a surface of said 3D projection.

Advantageously, said threshold is defined according to an angle of view of the user.

Advantageously, said threshold is defined according to a precision of said selection by the user.

The invention also discloses a computer program product, stored on a non-volatile computer-readable data-storage medium, comprising computer-executable instructions to cause a computer system to carry out the computer-implemented method according to an embodiment of the invention.

The invention also discloses a non-transitory computer-readable data-storage medium containing computer-executable instructions to cause a computer system to carry out a method according to an embodiment of the invention.

The invention also discloses a computer system configured for implementing the method according an embodiment of the invention, comprising: at least one display; at least one input interface; at least one computing device, configured to execute a method according to an embodiment of the invention.

BRIEF DESCRIPTION OF THE DRAWINGS

The disclosure will be better understood and its various features and advantages will emerge from the following description of a number of exemplary embodiments provided for illustration purposes only and its appended figures in which.

DETAILED DESCRIPTION

Figure 1:
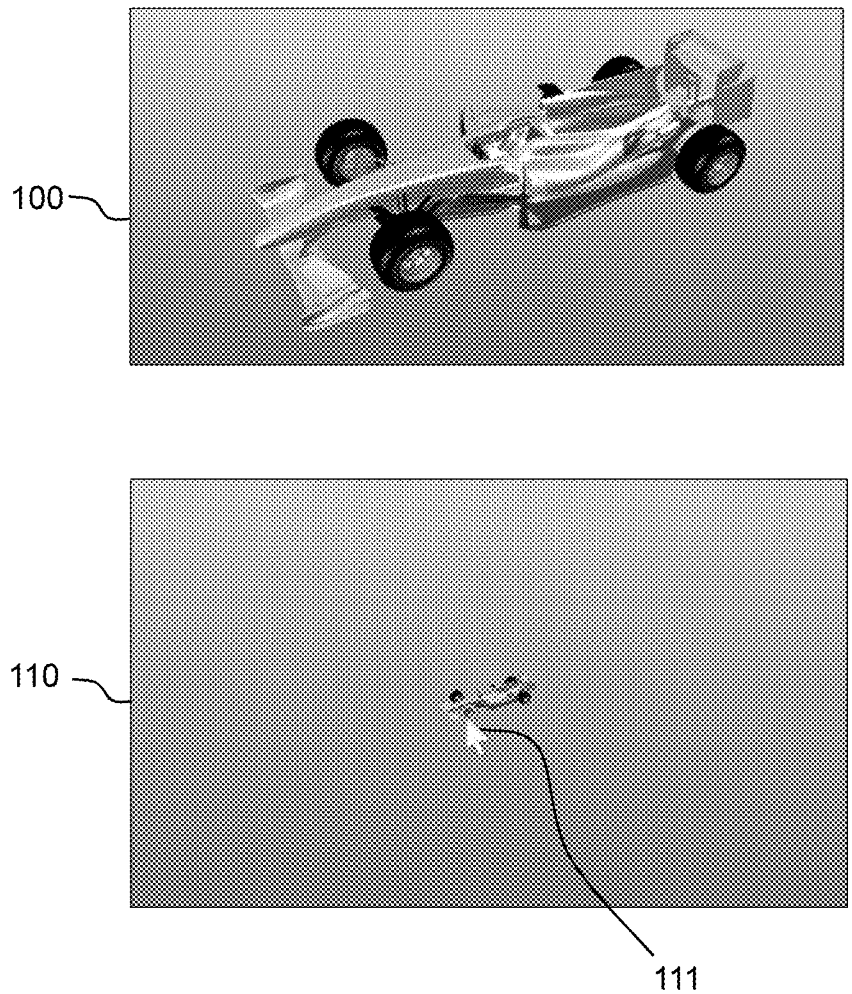
FIG. 1 displays an example of a 3D scene, viewed under two different zooms, and a selection of a 3D object, in the prior art.

FIG. 1 displays an example of a 3D scene, viewed under two different zooms, and a selection of a 3D object.

The image 100 shows a 3D scene representing a car. The 3D scene may for example be edited by a CAD application such as CATIA composer, or any other 3D application wherein a user can interact with 3D objects. The scene is composed of a number of 3D objects, that each represent parts of a car. For example, each wheel is represented by one 3D object. The user can click on different parts of the car to select the corresponding 3D objects. The scene can be associated to one or more point of view, that can be edited.

The image 110 shows the same scene, wherein the user has performed a zoom out, to have a "bird view" of the car. Under this zoom, the user is still able to click on parts of the car to select the corresponding 3D objects. For example, when the user clicks on the wheel 111, the wheel is selected and highlighted. However, this does not really make sense, because the user is, at this level of zoom, not really able to distinguish the various parts. At this level of zoom, the user more likely attempted to select the car as a whole, rather than only the wheel 111.

However, previous systems use the same rules of selection whatever the zoom, and the apparent size of the 3D objects. Therefore, they are not able to perform a selection that is likely to meet the intent of the user.

Figure 2:
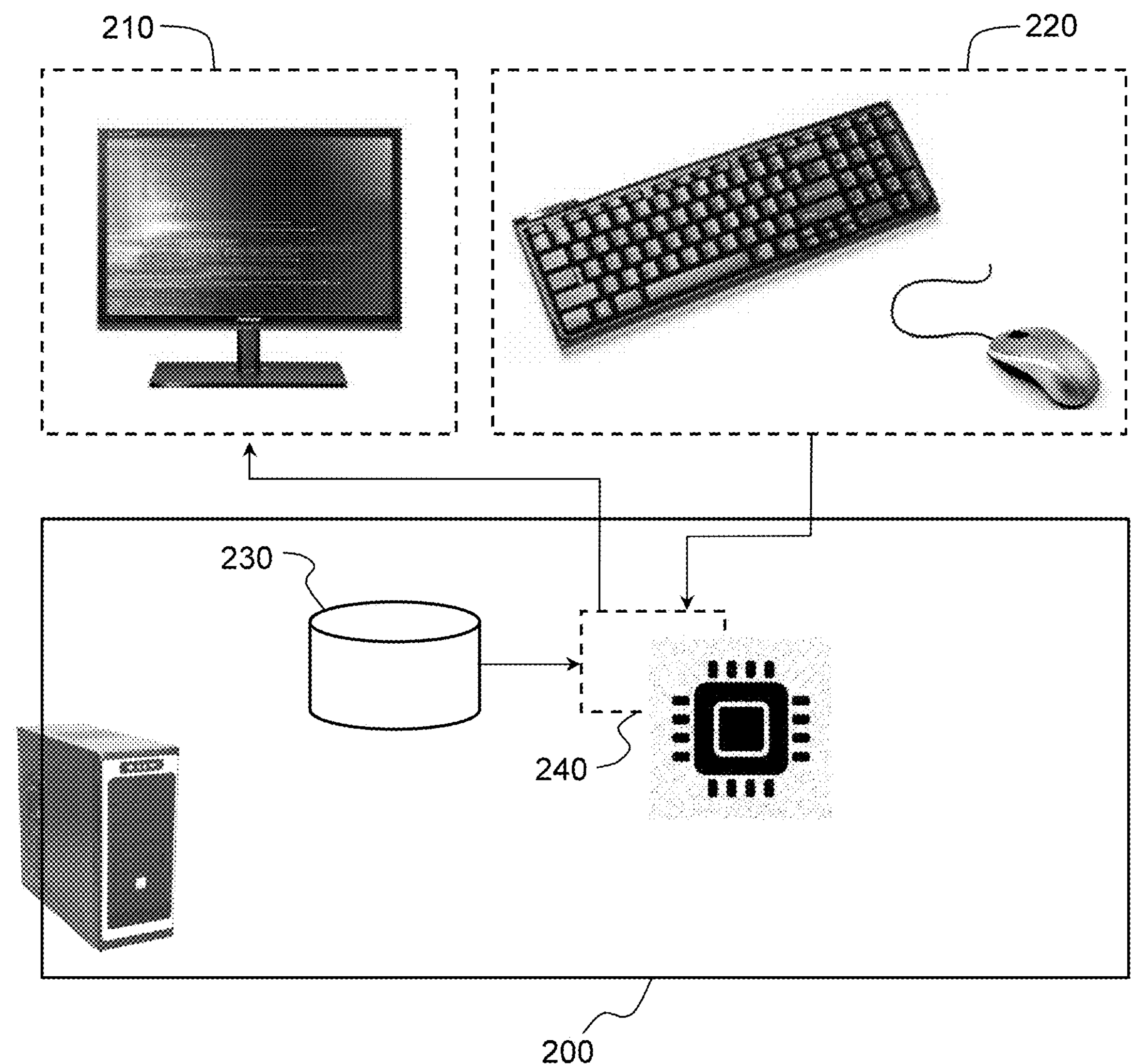
FIG. 2 displays an example of a functional architecture of a device in a number of embodiments of the invention.

FIG. 2 displays an example of a functional architecture of a device in a number of embodiments.

The device 200 may be any kind of device with computing capabilities. For example, the device 200 may be a computer, a smartphone or a tablet, an IoT device, a server or the like.

The device comprises an access to at least one display 210. The display 210 can be any kind of display allowing the user to view images from the device 200. For example, the display 210 may be any screen or the like such as glasses, a tactile screen, a watch or a video projector. The display 210 may be embedded within the same housing as the device 200. This is for example the case if the display 210 is a screen (whether tactile or not) of a smartphone or a tablet. The display may also be embedded within a housing separated from the device 200, and the device 200 connected to the display 210. It is for example the case if the display is a separate screen, or a video projector. The device 200 can be associated to the display 210 through any kind of connection, for example through a wire or a wireless connection (e.g Bluetooth™, Wi-Fi™, or any kind of wireless connection allowing the device 200 to send images to the display 210). For the sake of simplicity, in the remaining of the disclosure the at least one display 210 will be described as "the display". However, according to various embodiments, more than one display may be used. For example, a computing device with a plurality of screens may be used, the set of objects being displayed on the plurality of screens.

The display can also be a combination of elementary displays. For example, the display can comprise two screens side by side, and the user can use seamlessly the two screens.

The device 200 also comprises at least one input interfaces 220 to receive commands from a user, to select one or more 3D objects. The at least one input interfaces 220 can be any kind of interface allowing the user to input commands such as a mouse, buttons, keys, keyboard, eyes contact or the like.

Although FIG. 1 displays the at least one input interfaces 220 as being a connection to a mouse and a keyboard in a separate housing, according to various embodiments, the at least one input interfaces may be either a connection to an external device, a part of the device, or a connection to the display 210. For example, the at least one input interfaces may comprise a wired or wireless connection to a mouse, a wired or wireless connection to a keyboard, a connection to an external tactile screen (which can in this case also serve as display 210), a touchpad or keyboard embedded within the housing of the device 200, a microphone to receive vocal commands, or any other kind of suitable input interface.

The device 200 further comprises an access to one or more memories 230 storing a set of 3D objects. The one or more memories 230 may be any kind of internal, external, volatile or non-volatile memories. For example, it can be formed by an internal or external hard drive, a memory in a cloud which can be accessed by the device 200, a memory shared among a plurality of devices, a memory on a server, a CD-ROM, or a combination thereof, or more generally any suitable memory or combination thereof.

The one or more memories 230 store a set of 3D objects. The set of 3D objects may for example represent parts of a product that is being designed in a CAD application. The disclosure is generally applicable to any set of 3D object in any 3D application wherein 3D objects are selectable by a user.

According to various embodiments, the display 210, input interface 220, and computing device 200 may be located in the same place, for example if the computing device is a workstation, and the display 210 and input interface 220 are the display and input interface of the workstation. They may also be located in different places, for example if the disclosure is implemented within a "Software as a Service" (Saas) application. In such case, the computing device 200 may be a server in connection with a user device that displays and receives input through a remote client such as a web browser.

As will be described in more details hereinafter, the device 200 allows the user to select one or more 3D objects of the set, to which further processing may be applied.

As already discussed, one objective is to ensure that this selection is consistent with the intent of the user.

To do so, the device 200 comprises a processing logic 240, which is configured to execute the steps of a computer-implemented method according to one embodiment, as defined below.

According to various embodiments, a processing logic may be a processor operating in accordance with software instructions, a hardware configuration of the processor, or a combination thereof. It should be understood that any or all of the functions discussed herein may be implemented in a pure hardware implementation and/or by a processor operating in accordance with software instructions, and/or a configuration of a machine learning engine or neural network. A processing logic may also be a multi-core processor executing operations in parallel, a series of processors, or a combination thereof. It should also be understood that any or all software instructions may be stored in a non-transitory computer-readable medium. The term "configuration of a processing logic" refers to any means (for example hardware configuration, software instructions, machine learning, training or neural network, or any other adaptation means or combination thereof) of adapting a processing logic to execute operations.

Figure 3A:
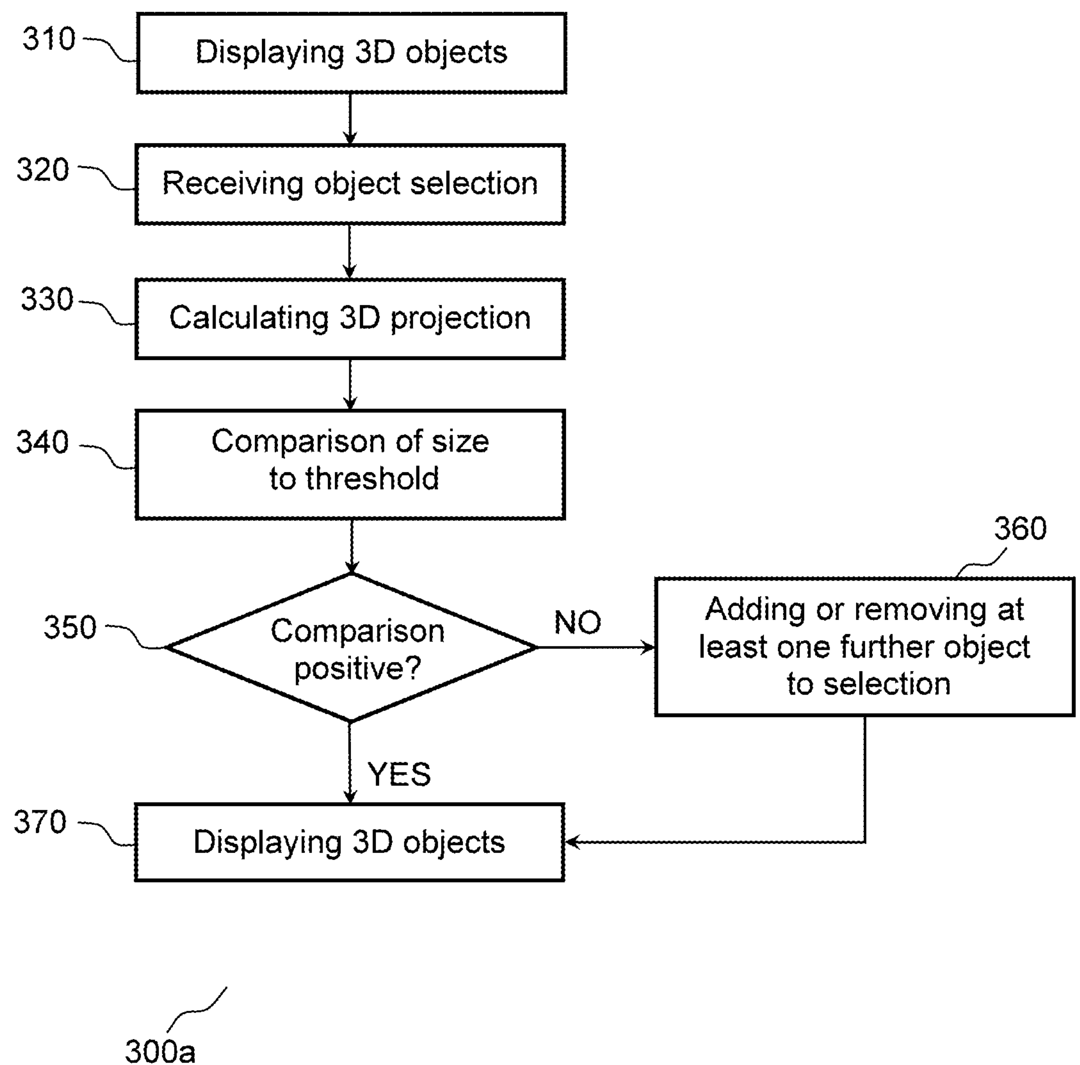
FIGS. 3*a* and 3*b* display two examples of computer-implemented methods in a number of embodiments of the invention.
Figure 3B:
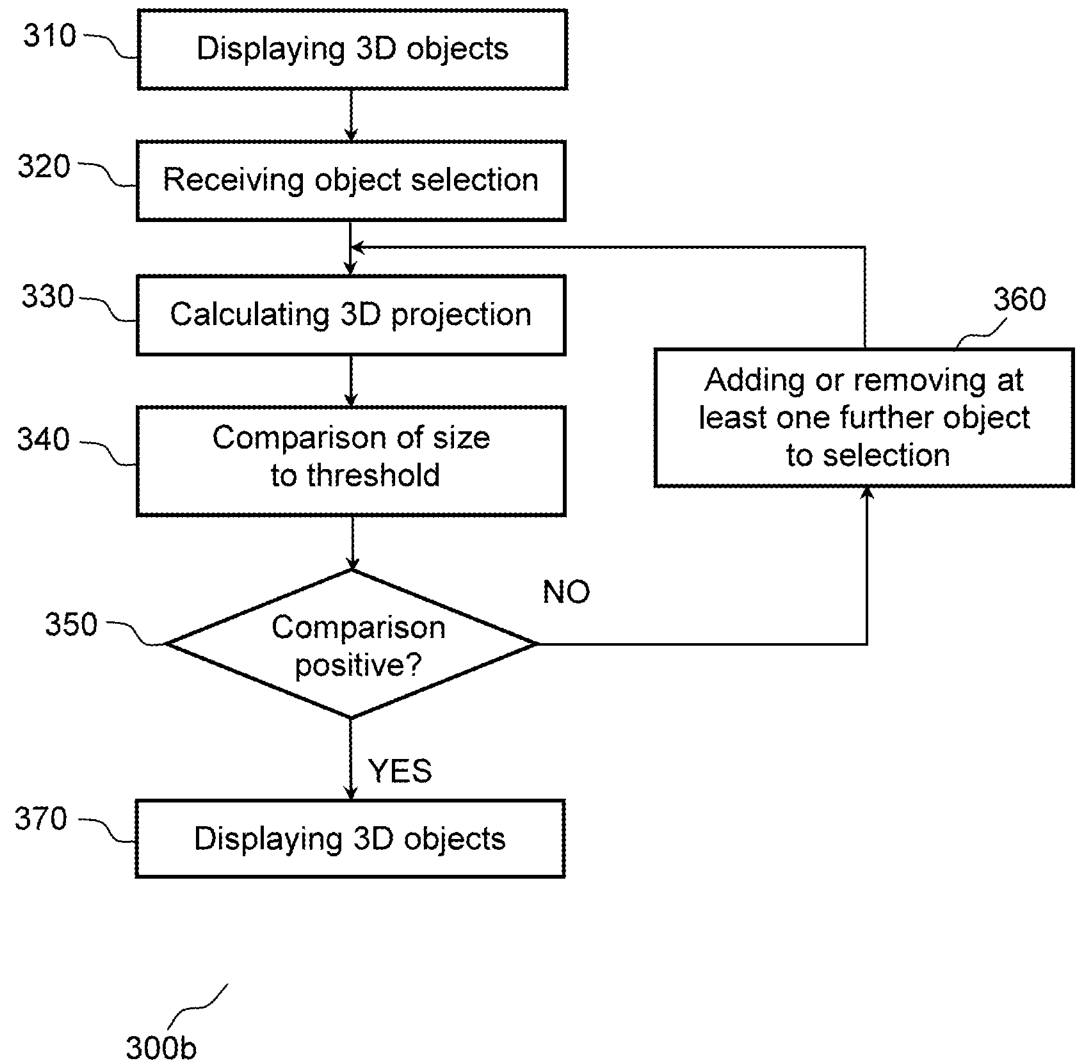

FIGS. 3*a* and 3*b* display two examples of computer-implemented methods in a number of embodiments.

FIG. 3*a* displays a first example of a computer-implemented method in a number of embodiments.

The computer-implemented method 300*a* is implementable on a wide number of computing devices. For the sake of simplicity, the method will be explained in connection to the device 200 represented in FIG. 2. The method 300*a* is intended to let a user select one or more 3D object, and make the selection apparent to the user.

To this effect, the method 300*a* comprises a first step 310 of displaying, on the display 210, a set of 3D objects. As already discussed, the set of 3D objects may represent all or a part of a 3D scene, and may be objects of any kind of 3D application, such as a 3D product in a CAD application. This allows a user to view the set of 3D objects The method 300*a* further comprises a second step 320 of receiving, from the at least one input interface 220, a selection by the user of at least one first 3D object belonging to said set.

This selection could be performed by any known method. For example, the user may click on one of the objects, or draw a rectangular shape that encompasses a plurality of objects. In the latter case, all the objects that are located within a bounding box which located in the rectangular shape may be selected.

The method 300*a* further comprises a third step 330 of calculating a 3D projection of the selection on the display 210.

Calculating a 3D projection consists in determining what is the 2D shape of the 3D objects when projected in 2D on the display 210. The 3D projections may depend at least upon the size, shape and position of the object, and a zoom ratio. It may also depend upon a resolution and size of the display 210. The 3D projection may also be implemented using any known 3D projection method.

The output of the 3D projection is typically a 2D shape, which may be defined as a set of pixels on which the selected 3D objects will be projected.

According to various embodiments, at least one size of 3D projection may be calculated.

A size of the 3D projection may be a distance, expressed for example in pixels, inches, or centimeters. This distance may be for example a height, a width, a diameter, a maximum extension, or a maximum distance between pixels that belong to the 3D projection.

Using as size the maximum distance between pixels that belong to the 3D projection provides the advantage of well defining the 1D extension of the object, and thus providing a good insight of what will be the importance of the object on the screen.

A size of the 3D projection may also be a surface of the 3D projection, expressed for example in number of pixels, square centimeters, or square inches.

Using as size of the 3D projection its surface allows obtaining information about the quantity of information that is viewed by the user to tailor the selection.

According to various embodiments, either a single or a plurality of sizes may be used. Sizes may also be combined within compound sizes. For example, a compound size may be obtained by combining the height and the width of the 3D projection, or by combining the height, the width and the surface of the 3D projection.

Once the at least one size of the 3D projection is obtained, it can be compared to at least one threshold, and the method 300*a* comprises a fourth step 340 of obtaining the outcome of this comparison.

Different comparisons may be used. For example, the comparison may consist in verifying if a size is lower than, equal to or higher than a threshold. The comparison may be also formed of a plurality of comparisons. For example, the outcome of the comparison can be positive if the surface of the 3D projection is higher than or equal to a minimum surface, and lower than or equal to a maximum surface. The comparisons may also concern a plurality of different sizes. For example, the comparison may be positive if the height of the 3D projection is higher than or equal to a minimum height, and the width of the 3D projection is higher than or equal to a minimum width.

Thus, according to various embodiments, the comparison allows to determine whether the at least one size of the 3D projection of the selection matches expected values, and thus correspond to a selection that the user was intended to perform. Stated otherwise, this allows determining whether the objects selected are large enough, and/or small enough to correspond to a desired selection. Of course, the at least one threshold can be adapted to the user needs.

According to various embodiments, the at least one threshold may be defined in many different ways.

In a number of embodiments, the at least one threshold is defined according to a point of view of the user.

This allows ensuring that the user benefits form a selection for which he has a relevant angle of view, whatever the size of the display. The angle of view can indeed be mapped to the display, to obtain a threshold in pixels, centimeters of inches for example. The angle of view can be determined for example according to the resolution of the display, and the distance between the user and the display.

In a number of embodiments, the at least one threshold is defined according to a precision of said selection by the user.

This allows ensuring that the size of the final selection is consistent with the size of the selection that the user was actually able to make.

The size of the selection can thus be for example adapted to a pointing method: for example, if the input interface is a tactile screen, a low threshold for a precise selection may be used if a precise selection method such as pointing with a stiletto was used, while a high threshold for an imprecise selection may be used if an imprecise selection method such a pressing a finger on the tactile screen was used.

The comparison of the 3D projection to at least one size therefore allows ensuring that the selection corresponds to a likely intent of the user, for example a set of objects that was properly seen, and/or that matches the precision of the selection of the user.

At step 350, the method 300*a* comprises a determination whether the outcome is positive or negative.

If the outcome is negative, the method 300*a* comprises an additional step 360 of adding to or removing from said selection at least one second 3D object.

This step may consist in adding at least one second 3D object to the selection, if the projection is too small, for example if the at least one size is lower than the at least one threshold, and/or removing 3D objects from the selection if the projection is too large, for example if the at least one size is higher than the at least one threshold.

This allows ensuring that the selection, as modified or not, complies with the expected intent of the user.

In a number of embodiments, the at least one second 3D object which is added to or removed from the selection is determined according to said at least one threshold.

This allows selecting the at least one second 3D object specifically to match the threshold, and thus ensure that the final selection contains only what is needed to match the threshold.

This may be performed in different ways. For example, a circle whose radius corresponds to the threshold of surface or distance may be calculated around the center of the selection by the user, and all the 3D objects whose 3D projection fall in the circle that do not belong to the selection may be added to the selection.

The method 300*a* comprises a final step 370 of modifying appearance parameters of the selection.

This allows the user to view the objects that have been selected, in order to ensure that the selection is correct, and modify the selection, and/or or be aware of the objects on which he will perform further actions.

The modification of the appearance parameters of the selection may consist in any modification of the appearance parameters that allows the user distinguishing the selected objects from the others: highlighting, modification of the colors, etc.

Therefore, the method 300*a* allows ensuring that the final selection, modified or not, that will be presented to the user will correspond to a selection that was likely intended to be performed by the user.

FIG. 3*b* displays a second example of a computer-implemented method in a number of embodiments.

The method 300*b* is very similar to the method 300*a*, and also comprises the steps 310, 320, 330, 340, 350, 360, and 370.

In addition, at the output of step 370, a new iteration of steps 330, 340, 350 is performed. Therefore, until the outcome of the comparison is positive at steps 340, and 350, that is to say until the at least one size of the 3D projection matches the at least one threshold, objects are removed or added at step 360, the 3D projection is calculated again at step 330, and at least one size of the projection is compared to at least one threshold at step 340. As many iterations as needed can be performed, until the 3D projection of the selection allows a positive outcome at steps 340 and 350.

This iterative addition or removal of objects to/from the selection allows adding or removing only what is needed to obtain a selection that was likely intended to be performed by the user.

The addition or removal of objects to the selection can be performed in different ways. For example, the embodiments discussed with reference to FIG. 3*a* may be applied.

In a number of embodiments, the addition of at least one second object to the selection comprises the adding to said selection at least one second 3D object in a vicinity of said 3D projection, and the removal of at least one second 3D object from the selection comprises removing from said selection at least one second 3D object at an edge of said 3D projection.

Thus, if 3D objects need to be added (for example if a size of the 3D projection is lower than a minimum threshold), objects at the vicinity of the selection are added, while, if 3D objects need to be removed (for example if a size of the 3D projection is higher than a maximum threshold), objects at the edge of the selection are removed. Thus, the selection is progressively expanded or diminished, until the desired size thresholds are met.

The choice of the objects to add or remove may also depend upon the size that is considered. For example, if the size is the height of the 3D projection, the objects may be added to or removed from the selection vertically, while, if the size is a width of the 3D projection, this may be done horizontally.

In a number of embodiments, the 3D objects are organized as a tree. For example, 3D objects are often grouped hierarchically in CAD applications, from lower-level to higher-level parts of a product. In such case, the natural hierarchy can be used for an efficient management of the selection if:

- the step of adding to the selection at least one second 3D object comprises defining the parent of the node as the selection;
- the step removing from the selection at least one second 3D object comprising defining the child of the node that comprises said first 3D object as the selection.

Thus, the selection can be extended or reduced to a higher/lower hierarchical level, respectively if objects need to be added (i.e if the 3D projection is too small according to the selected sizes and thresholds), or removed (i.e if the projection is too large according to the selected sizes or thresholds).

This allows the selection to correspond to the logical grouping of the 3D objects that was the more likely to be selected by the user.

In certain cases, none of the nodes corresponds to a selection that matches the criteria, for example if a child node is too small and its parent too big. In such case, the iterations can be stopped to select the hierarchical level that corresponds to a size that is the least different from the thresholds. Other rules may also be used to discriminate the most relevant level in such case. For example, if the 3D projection of the parent node cannot be completely seen in the display, the selection of the child node may be preferred.

Figure 4:
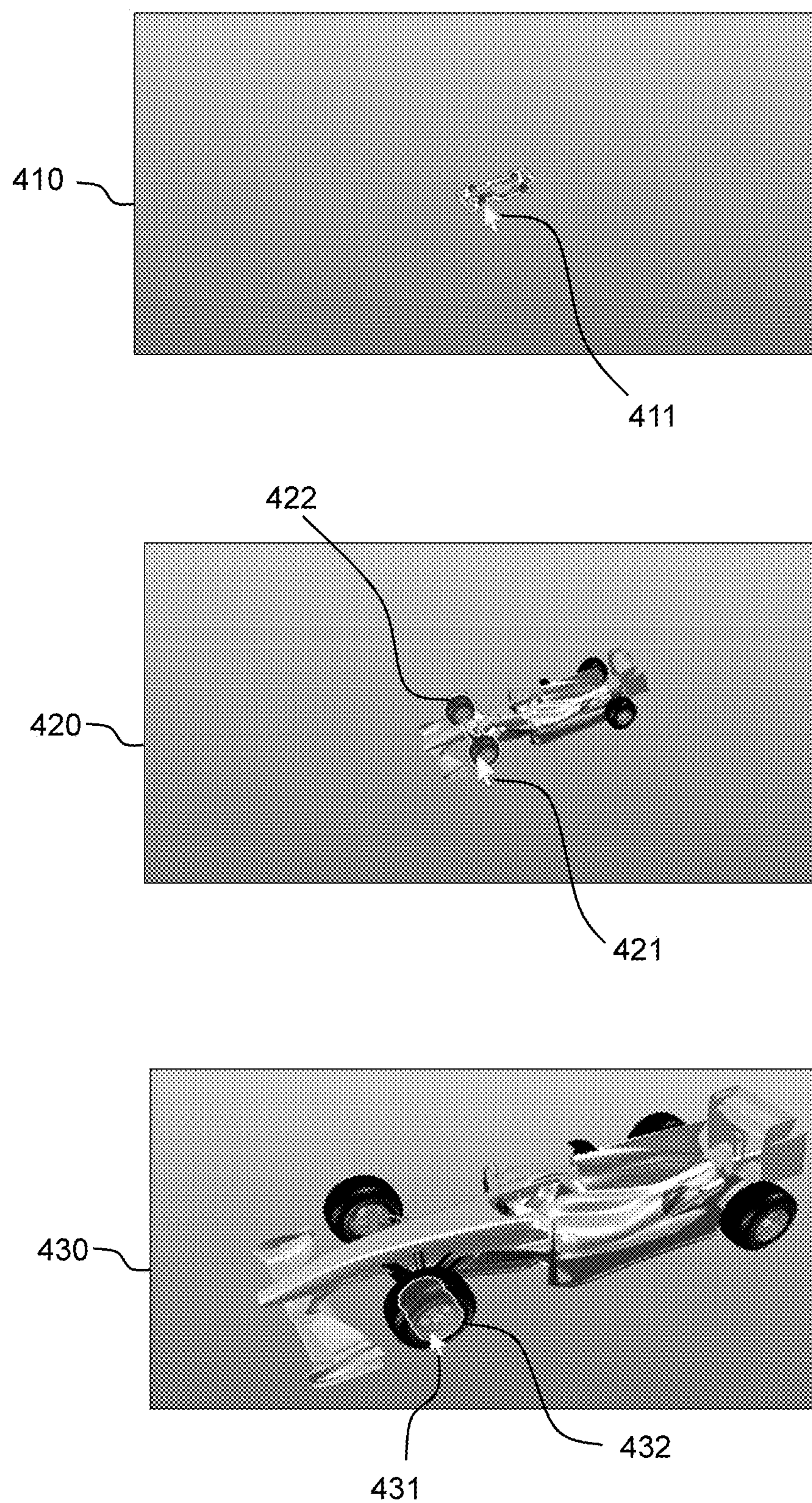
FIG. 4 displays three examples of selection of 3D objects, in the same 3D scene at 3 different zoom ratios.

FIG. 4 displays 3 examples of selection of 3D objects, in the same 3D scene at 3 different zoom ratios.

In the FIG. 4, the images 410, 420, 430 represent a 3D scene of a CAD application, which comprises a formula 1 car modeled as an assembly of 3D parts.

The only difference between images 410, 420 and 430 is the zoom ratio that is used: in 410 the zoom ratio is very low, to show a "bird view" of the car; in 420 the zoom is an average zoom, that allow recognizing the car and its main parts; in 430, a high zoom is used, that renders apparent lots of details of the car.

In each case, the user clicks on the same location 411, 421, 431 of a wheel of the car. However, thanks to the disclosure, the selection is different:

- in 410, the whole car is selected and highlighted 412;
- in 411, the two front wheels 422 are selected, as well as the mechanical parts in between;
- in 412, only an inner part 432 of the wheel, on which the user clicked, is selected.

Thus, in both cases, the selection correspond to a logical choice of the user depending on the zoom ratio, and the apparent sizes of the 3D objects: under the click of the user, it would indeed not have made sense to select only a part of the car in 410, while it would not have made sense to select the whole car in 430.

This improved selection enhances the ability of the user to interact with virtually any 3D application.

In this example, the 3D objects that represent the car are organized hierarchically in a tree of parts. This allows selecting, in 420, the right level of abstraction, which corresponds to a logical grouping 422/421.

Figure 5:
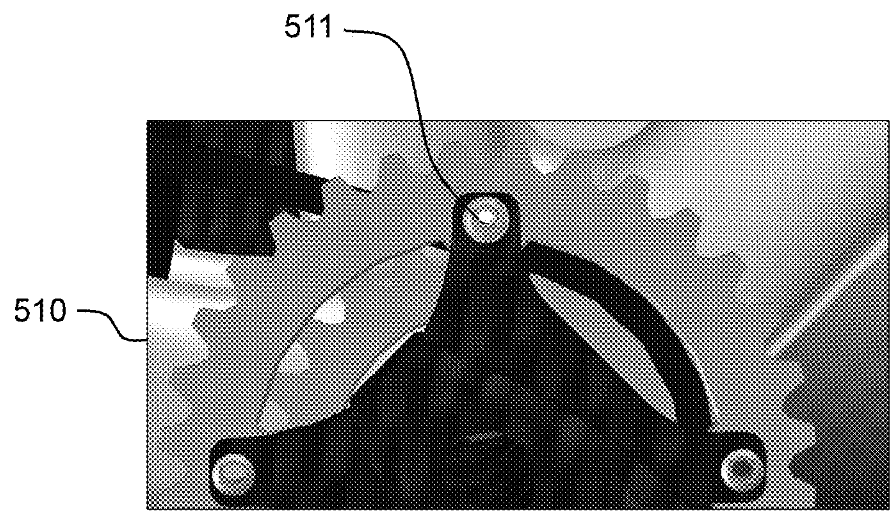
FIG. 5 displays an example of a selection of a 3D part in a gear modeled as 3D objects organized by hierarchical levels.
Figure 5:
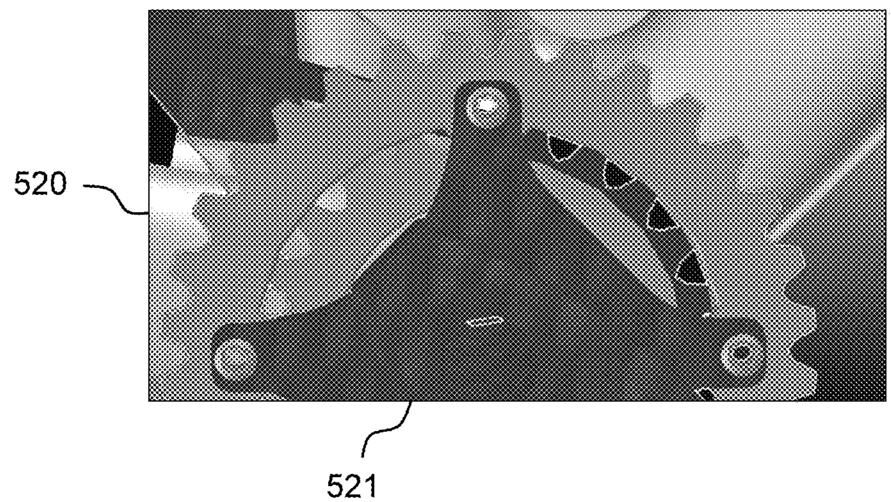

FIG. 5 displays an example of a selection of a 3D part in a gear modeled as 3D objects organized by hierarchical levels.

The images 510 and 520 both represents a 3D scene of a 3D CAD application, wherein a gear is modeled. The gear is modeled as a hierarchical tree of 3D parts.

In 510, the user clicks on the part 511, which is thus selected and highlighted. In this example, the part 511 corresponds to a node of the tree, and its parent represents the whole gear. The selection of the whole gear 521 is not performed here, because, at the current zoom ratio, the size of the gear is too big, and the 3D projection of the gear does not even fit the display area.

The examples above demonstrate the ability of the disclosure to provide to users an efficient and intuitive selection of 3D objects.

The examples described above are however given as non-limitative illustrations of embodiments. They do not in any way limit the scope of the disclosure which is defined by the following claims.

The invention claimed is:

1. A computer-implemented method, comprising:

displaying on at least one display, a set of 3D objects;

receiving from at least one input interface a selection by a user of at least one first 3D object belonging to said set;

calculating a 3D projection of said selection on said display;

obtaining the outcome of a comparison of at least one size of said 3D projection to two thresholds, the outcome of the comparison being positive if the size of the 3D projection is higher than or equal to a first threshold corresponding to a minimum size, and lower than or equal to a second threshold corresponding to a maximum size;

while the outcome of said comparison is negative, a plurality of iterations of:

adding to or removing from said selection, at least one second 3D object, calculating the 3D projection of said selection on said display, and obtaining the outcome of said comparison of said at least one size of said 3D projection to said two thresholds; and modifying appearance parameters of said selection.

2. The computer-implemented method of claim 1, wherein said at least one second 3D object is determined according to at least one threshold.

3. The computer-implemented method of claim 2, wherein said at least one size is a maximum distance between pixels of said 3D projection.

4. The computer-implemented method of claim 2, wherein said at least one size is a surface of said 3D projection.

5. The computer implemented method of claim 2, wherein said at least one threshold is defined according to an angle of view of the user or a precision of said selection by the user.

6. The computer-implemented method of claim 1, wherein adding to or removing from said selection, at least one second 3D object further includes adding, to said selection, at least one second 3D object in a vicinity of said 3D projection, or removing, from said selection, at least one second 3D object at an edge of said 3D projection.

7. The computer-implemented method of claim 6, wherein said at least one size is a maximum distance between pixels of said 3D projection.

8. The computer-implemented method of claim 6, wherein said at least one size is a surface of said 3D projection.

9. The computer-implemented method of claim 1, wherein said set of 3D objects is organized as a tree, wherein said selection is defined as a node of the tree and includes children of the node, wherein adding to said selection, at least one second 3D object, further includes defining a parent of the node as the selection, and wherein removing from said selection, at least one second 3D object, further includes defining a child of the node that comprises said first 3D object as the selection.

10. The computer-implemented method of claim 9, wherein said at least one size is a maximum distance between pixels of said 3D projection.

11. The computer-implemented method of claim 9, wherein said at least one size is a surface of said 3D projection.

12. The computer-implemented method of claim 1, wherein said at least one size is a maximum distance between pixels of said 3D projection.

13. The computer-implemented method of claim 1, wherein said at least one size is a surface of said 3D projection.

14. The computer implemented method of claim 1, wherein at least one threshold is defined according to an angle of view of the user.

15. The computer implemented method of claim 1, wherein at least one threshold is defined according to a precision of said selection by the user.

16. The computer-implemented method of claim 1, wherein said at least one size is a maximum distance between pixels of said 3D projection.

17. The computer-implemented method of claim 1, wherein said at least one size is a surface of said 3D projection.

18. A non-transitory computer-readable data-storage medium containing computer-executable instructions that when executed by a computer system cause the computer system to implement a method, comprising:

displaying on at least one display, a set of 3D objects;

receiving from at least one input interface a selection by a user of at least one first 3D object belonging to said set;

calculating a 3D projection of said selection on said display;

obtaining the outcome of a comparison of at least one size of said 3D projection to two thresholds, the outcome of the comparison being positive if the size of the 3D projection is higher than or equal to a first threshold corresponding to a minimum size, and lower than or equal to a second threshold corresponding to a maximum size;

while the outcome of said comparison is negative, a plurality of iterations of:

adding to or removing from said selection, at least one second 3D object, calculating the 3D projection of said selection on said display, and obtaining the outcome of said comparison of said at least one size of said 3D projection to said two thresholds; and modifying appearance parameters of said selection.

19. A computer system, comprising:

at least one display;

at least one input interface;

at least one processor, wherein the processor is configured to:

display on at least one display, a set of 3D objects, receive from the at least one input interface a selection by a user of at least one first 3D object belonging to said set, calculate a 3D projection of said selection on said display, obtain the outcome of a comparison of at least one size of said 3D projection to two thresholds, the outcome of the comparison being positive if the size of the 3D projection is higher than or equal to a first threshold corresponding to a minimum size, and lower than or equal to a second threshold corresponding to a maximum size, while the outcome of said comparison is negative, a plurality of iterations of:

adding to or removing from said selection, at least one second 3D object, calculating the 3D projection of said selection on said display, and obtaining the outcome of said comparison of said at least one size of said 3D projection to said two thresholds, and modify appearance parameters of said selection.

* * * * *